(12) United States Patent
Hung et al.

(10) Patent No.: US 6,849,193 B2
(45) Date of Patent: *Feb. 1, 2005

(54) HIGHLY SELECTIVE PROCESS FOR ETCHING OXIDE OVER NITRIDE USING HEXAFLUOROBUTADIENE

(76) Inventors: Hoiman Hung, 1282 Burkett Dr., San Jose, CA (US) 95129; Joseph P Caulfield, 3543 Brook St., #104, Lafayette, CA (US) 94549; Hongqing Shan, 3630 Tumble Way, San Jose, CA (US) 95132; Ruiping Wang, 622 Sammie Ave., Fremont, CA (US) 94539; Gerald Zheyao Yin, 10132 Bilich Pl., Cupertino, CA (US) 95014

( * ) Notice: Subject to any disclaimer, the term of this patent is extended or adjusted under 35 U.S.C. 154(b) by 235 days.

This patent is subject to a terminal disclaimer.

(21) Appl. No.: 10/144,635
(22) Filed: May 13, 2002

(65) Prior Publication Data

US 2003/0000913 A1 Jan. 2, 2003

Related U.S. Application Data

(62) Division of application No. 09/276,311, filed on Mar. 25, 1999, now Pat. No. 6,387,287.

(51) Int. Cl.[7] .............................................. H01L 21/00
(52) U.S. Cl. ............................ 216/67; 216/68; 216/72; 216/79; 216/80; 438/710; 438/723; 438/743
(58) Field of Search .............................. 216/39, 51, 67, 216/68, 70, 72, 79, 80; 438/710, 723, 729, 732, 740, 743

(56) References Cited

U.S. PATENT DOCUMENTS

| 4,162,185 A | 7/1979 | Coburn et al. .............. 156/643 |
| 4,180,432 A | 12/1979 | Clark ........................ 156/643 |
| 4,654,448 A | 3/1987 | Bargigia et al. ............ 570/156 |
| 4,839,306 A | * 6/1989 | Wakamatsu ................. 438/424 |
| 5,300,460 A | 4/1994 | Collins ........................ 437/225 |
| 5,338,399 A | 8/1994 | Yanagida .................... 156/662 |
| 5,366,590 A | 11/1994 | Kadomura ................. 156/662 |
| 5,445,712 A | 8/1995 | Yanagida .................... 156/662 |
| 5,477,975 A | 12/1995 | Rice et al. .................... 216/68 |
| 5,698,070 A | 12/1997 | Hirano et al. ............ 156/643.1 |

(List continued on next page.)

FOREIGN PATENT DOCUMENTS

| EP | 0644 584 A1 | 9/1994 |
| JP | 57-108267 | 6/1982 |
| JP | 57-155732 | 9/1982 |
| JP | 3-276626 | 12/1991 |
| JP | 4-346428 | 12/1992 |
| JP | 9-191002 | 7/1997 |
| JP | 11-186229 | 9/1999 |
| WO | WO 99/16110 A3 | 4/1999 |
| WO | WO 99/16110 A2 | 4/1999 |
| WO | WO 99/34419 | 8/1999 |

*Primary Examiner*—Allan Olsen
(74) *Attorney, Agent, or Firm*—Charles S. Guenzer; Joseph Bach

(57) ABSTRACT

An oxide etching process, particularly useful for selectively etching oxide over a feature having a non-oxide composition, such as silicon nitride and especially when that feature has a corner that is prone to faceting during the oxide etch. The invention uses a heavy perfluorocarbon, for example, hexafluorobutadiene ($C_4F_6$) or hexafluorobenzene ($C_6F_6$). The fluorocarbon together with a substantial amount of a noble gas such as argon is excited into a high-density plasma in a reactor which inductively couples plasma source power into the chamber and RF biases the pedestal electrode supporting the wafer. A more strongly polymerizing fluorocarbon such as difluoromethane ($CH_2F_2$) is added in the over etch to protect the nitride corner. Oxygen or nitrogen may be added to counteract the polymerization. The same chemistry can be used in a magnetically enhanced reactive ion etcher (MERIE) or with a remote plasma source.

41 Claims, 6 Drawing Sheets

U.S. PATENT DOCUMENTS

| | | |
|---|---|---|
| 5,707,486 A | 1/1998 | Collins .................... 156/643.1 |
| 5,770,098 A | 6/1998 | Araki et al. ................. 216/67 |
| 5,935,877 A | 8/1999 | Autryve ...................... 438/743 |
| 5,989,929 A | 11/1999 | Nikoh et al. .................. 438/9 |
| 6,009,830 A | 1/2000 | Li et al. ................ 118/723 R |
| 6,069,092 A | 5/2000 | Imai et al. .................. 438/723 |
| 6,103,137 A | 8/2000 | Park ............................ 216/67 |
| 6,174,451 B1 * | 1/2001 | Hung et al. .................... 216/67 |
| 6,362,109 B1 * | 3/2002 | Kim et al. ................... 438/706 |
| 6,403,491 B1 * | 6/2002 | Liu et al. .................... 438/710 |
| 6,432,318 B1 * | 8/2002 | Ding et al. ................... 216/67 |
| 6,451,703 B1 * | 9/2002 | Liu et al. .................... 438/710 |
| 6,613,689 B2 * | 9/2003 | Liu et al. .................... 438/712 |

\* cited by examiner

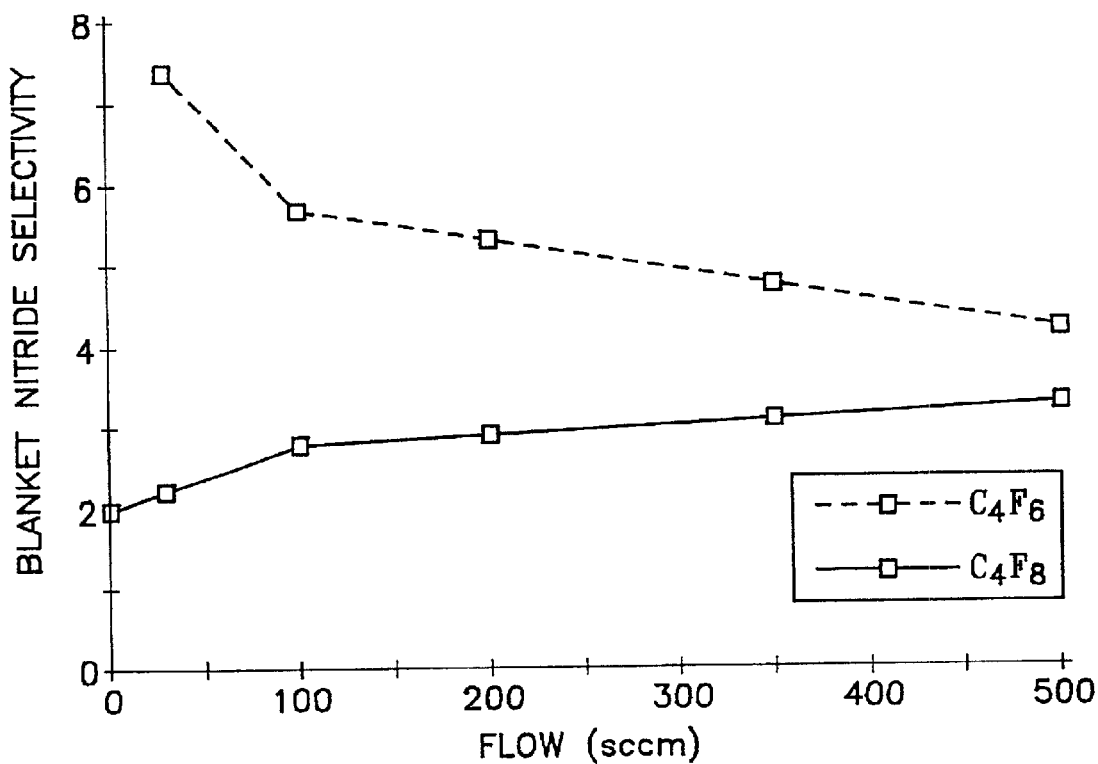
FIG. 10
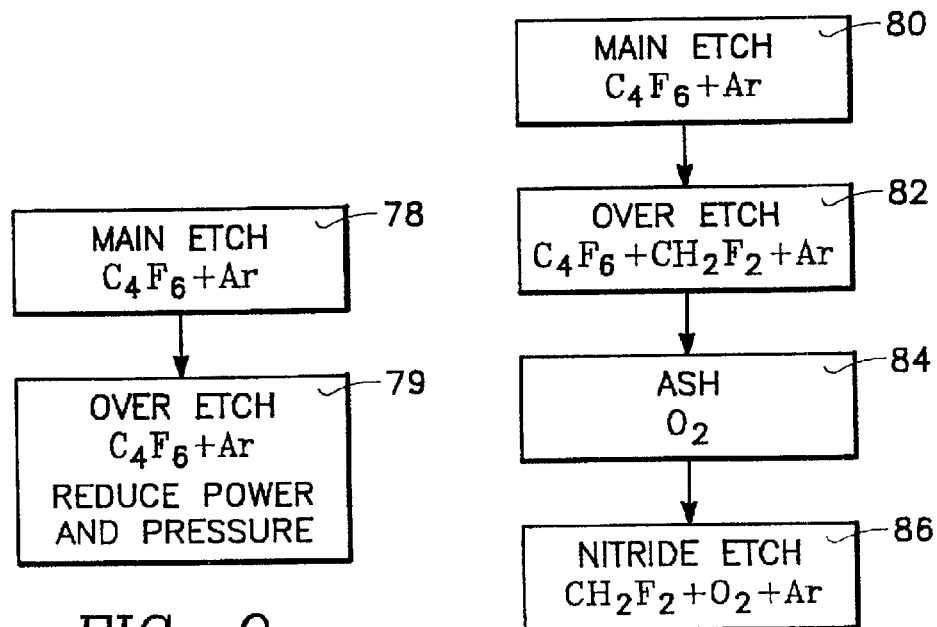
FIG. 9
FIG. 11

HIGHLY SELECTIVE PROCESS FOR ETCHING OXIDE OVER NITRIDE USING HEXAFLUOROBUTADIENE

RELATED APPLICATIONS

This application is a division of Ser. No. 09/276,311, filed Mar. 25, 1999 now U.S. Pat. No. 6,387,287, issue fee paid.

FIELD OF THE INVENTION

The invention relates generally to etching of silicon integrated circuits. In particular, the invention relates to etching silicon oxide and related materials in a process that is capable of greatly reduced etching rates for silicon nitride and other non-oxide materials but still producing a vertical profile in the oxide.

BACKGROUND ART

In the fabrication of silicon integrated circuits, the continuing increase in the number of devices on a chip and the accompanying decrease in the minimum feature size have placed increasingly difficult demands upon many of the many fabrication steps used in their fabrication including depositing layers of different materials onto sometimes difficult topologies and etching further features within those layers.

Oxide etching has presented some of the most difficult challenges. Oxide is a somewhat generic term used for silica, particularly silicon dioxide ($SiO_2$) although slightly non-stoichiometric compositions $SiO_x$ are also included, as is well known. The term oxide also covers closely related materials, such as oxide glasses including borophosphosilicate glass (BPSG). Some forms of silicon oxynitride are considered to more closely resemble an oxide than a nitride. Small fractions of dopants such as fluorine or carbon may be added to the silica to reduce its dielectric constant. Oxide materials are principally used for electrically insulating layers, often between different levels of the integrated circuit. Because of the limits set by dielectric breakdown, the thickness of the oxide layers cannot be reduced to much below 0.5 to 1 $\mu$m. However, the minimum feature sizes of contact and via holes penetrating the oxide layer are being pushed to well below 0.5 $\mu$m, the current developmental goal being 0.18 $\mu$m with further decreases being planned. The result is that the holes etched in the oxide must be highly anisotropic and must have high aspect ratios, defined as the depth to the minimum width of the hole. A further problem arises from the fact that the underlying silicon may be formed with active doped regions of thicknesses substantially less than the depth of the etched hole (the oxide thickness). Due to manufacturing variables, it has become impossible to precisely time a non-selective oxide etch to completely etch through the silicon oxide without a substantial probability of also etching through the underlying active silicon region.

The required anisotropy can be achieved by dry plasma etching in which a fluorine-containing etching gas, typically a fluorocarbon, is electrically excited into a plasma. The plasma conditions may be adjusted to produce highly anisotropic etching in many materials. However, the anisotropy should not be achieved by operating the plasma reactor in a purely sputtering mode in which the plasma ejects particles toward the wafer with sufficiently high energy that they sputter the oxide. Sputtering is generally non-selective, and high-energy sputtering also seriously degrades semiconducting silicon exposed at the bottom of the etched contact hole.

In view of these and other problems, selective etching processes have been developed which depend more upon chemical effects. These processes are often described as reactive ion etching (RIE). A sufficiently high degree of selectivity allows new structures to be fabricated without the need for precise lithography for each level.

An example of such an advanced structure is a self-aligned contact (SAC), illustrated in the cross-sectional view of FIG. 1. A SAC structure for two transistors is formed on a silicon substrate 2. A polysilicon gate layer 4, a tungsten silicide barrier and glue layer 6, and a silicon nitride cap layer 8 are deposited and photolithographically formed into two closely spaced gate structures 10 having a gap 12 therebetween. Chemical vapor deposition is then used to deposit onto the wafer a substantially conformal layer 14 of silicon nitride ($Si_3N_4$), which coats the top and sides of the gate structures 10 as well as the bottom 15 of the gap 12. In practice, the nitride deviates from the indicated stoichiometry and may have a composition of $SiN_x$, where x is between 1 and 1.5. The nitride acts as an electrical insulator. Dopant ions are ion implanted using the gate structures 10 as a mask to form a self-aligned p-type or n-type well 16, which acts as a common source for the two transistors having respective gates 10. The drain structures of the two transistors are not illustrated.

An oxide field layer 18 is deposited over this previously defined structure, and a photoresist layer 20 is deposited over the oxide layer 18 and photographically defined into a mask. A subsequent oxide etching step etches a contact hole 22 through the oxide layer 18 and stops on the portion 24 of the nitride layer 14 underlying the hole 22. It is called a contact hole because the metal subsequently deposited into the contact hole 22 contacts underlying silicon rather than a metallic interconnect layer. A post-etch sputter removes the nitride portion 24 at the bottom 15 of the gap 12. The silicon nitride acts as an electrical insulator between the gate structure 10 and the metal, usually aluminum, which is thereafter filled into the contact hole 22.

Because the nitride acts as an insulator, the SAC structure and process offer the advantage that the contact hole 22 may be wider than the width of the gap 12 between the gate structures 10. In advanced devices, the gap 12 may be very small, less than 10 nm while the width of the contact hole 22 may be significantly larger. Additionally, the photolithographic registry of the contact hole 22 with the gate structures 10 need not be precise. The imprecise definition of the mask in the photoresist layer 20 may place one side of the contact hole 22 near the middle of the gap 12. Nonetheless, this may still provide a good contact. However, to achieve these beneficial effects, the SAC oxide etch must be highly selective to nitride. That is, the process must produce an oxide etch rate that is much greater than the nitride etch rate. Numerical values of selectivity are calculated as the ratio of the oxide to nitride etch rates. Selectivity is especially critical at the corners 26 of the nitride layer 14 above and next to the gap 12 since the corners 26 are the portion of the nitride exposed the longest to the oxide etch. Furthermore, they have a geometry favorable to fast etching that tends to create facets at the corners 26. The corners of the gate structures 10 will thereby be prematurely exposed if the faceting is severe enough.

Furthermore, increased selectivity is being required as a result of chemical mechanical polishing (CMP) being used to planarize an oxide layer deposited onto a curly wafer. The polishing planarization produces a flat top surface in the oxide layer over the wavy underlying substrate, thereby producing an oxide layer of significantly varying thickness.

To compensate for this variable thickness, the time of the oxide etch must be set significantly higher, say by 100%, than the etching time for the design thickness to assure penetration of the variable thickness oxide. This extra etching time is called over etch, which also accommodates other process variations. However, for the regions with a thinner oxide, the nitride is exposed that much longer to the etching environment.

Ultimately, the required degree of selectivity is reflected in the probability of an electrical short through the nitride layer 14 between one of the gate structures 10 and the metal filled into the contact hole 22. The etch must also be selective to photoresist, for example at facets 28 that develop at corners of the mask 20, but the requirement of photoresist selectivity is not so stringent since the photoresist layer 20 may be made much thicker than the nitride layer 14.

In the future, the most demanding etching steps are projected to be performed with high-density plasma (HDP) etch reactors. Such HDP etch reactors achieve a high-density plasma having a minimum average ion density of $10^{11}$ cm$^{-3}$ across the plasma exclusive of the plasma sheath. Although several techniques are available for achieving a high-density plasma such as electron cyclotron resonance and remote plasma sources, the commercially most important technique involves inductively coupling RF energy into the source region. The inductive coil may be cylindrically wrapped around the sides of chamber or be a flat coil above the top of the chamber or represent some intermediate or combination geometry.

IPS Reactor

An example of an inductively coupled plasma etch reactor is the Inductive Plasma Source (IPS) etch reactor, which is available from Applied Materials and which Collins et al. describe in U.S. patent application Ser. No. 08/733,544, filed Oct. 21, 1996 and in European Patent Publication EP-840, 365-A2. As shown in FIG. 2, a wafer 30 to be processed is supported on a cathode pedestal 32 supplied with RF power from a first RF power supply 34. A silicon ring 36 surrounds the pedestal 32 and is controllably heated by an array of heater lamps 38. A grounded silicon wall 40 surrounds the plasma processing area. A silicon roof 42 overlies the plasma processing area, and lamps 44, and water cooling channels 46 control its temperature. The volume of the vacuum processing chamber is about 23 liters. The temperature-controlled silicon ring 36 and silicon roof 42 may be used to scavenge fluorine from the fluorocarbon plasma. For some applications, fluorine scavenging can be accomplished by a solid carbon body, such as amorphous or graphitic carbon, or by other non-oxide silicon-based or carbon-based materials, such as silicon carbide.

Processing gas is supplied from one or more bottom gas feeds 48 through a bank of mass flow controllers 50 under the control of a system controller 52, in which is stored the process recipe in magnetic or semiconductor memory. Gas is supplied from respective gas sources 54, 56, 58. The conventional oxide etch recipe uses a combination of a fluorocarbon or hydrofluorocarbon and argon. Octafluorocyclobutane ($C_4F_8$) and trifluoromethane ($CHF_3$) are popular fluorocarbons, but other fluorocarbons, hydrofluorocarbons, and combinations thereof are used, and these other etching gases are the subject of at least part of this invention.

An unillustrated vacuum pumping system connected to a pumping channel 60 around the lower portion of the chamber maintains the chamber at a preselected pressure, as set by the controller 52.

The controller 52 controls the various reactor element according to the etch recipe and thus determines the etch process.

In the used configuration, the silicon roof 42 is grounded, but its semiconductor resistivity and thickness are chosen to pass generally axial RF magnetic fields produced by an inner inductive coil stack 62 and an outer inductive coil stack 64 powered by respective RF power supplies 66, 68. A single RF power supply and an RF power splitter may be substituted. In the IPS reactor used in the experiments to be the described, the frequencies of the three RF power supplies are all different and in the low megahertz range.

Optical emission spectroscopy (OES) is a conventional monitoring process used for end-point detection in plasma etching. An optical fiber 70 is placed in a hole 72 penetrating the chamber wall 40 to laterally view the plasma area 74 above the wafer 30. An optical detector system 76 is connected to the other end of the fiber 70 and includes one or more optical filters and processing circuitry that are tuned to the plasma emission spectrum associated with the aluminum, copper, or other species in the plasma. Either the raw detected signals or a trigger signal is electronically supplied to the controller 52, which can use the signals to determine that one step of the etch process has been completed as either a new signal appears or an old one decreases. With this determination, the controller 52 can adjust the process recipe or end the etching step according to the power levels set primarily in the source power supplies 66, 68.

The IPS chamber is highly flexible in operation. It can produce a high-density or a low-density plasma. The temperature of the silicon surfaces and of the wafer can be controlled. The bias power applied to the cathode 32 by the bias power supply 34 can be adjusted independently of the source power applied to the coils 62, 64.

It has become recognized, particularly in the use of HDP etch reactors, that selectivity in an oxide etch can be achieved by a fluorocarbon etching gas forming a polymer layer upon the non-oxide portions, thereby protecting them from etching, while the oxide portions remain exposed to the etching environment. Polymer forming on the oxide sidewalls also promote vertical etching profiles. It is believed that the temperature controlled silicon ring 36 and roof 42 in the reactor of FIG. 2 control the fluorine content of the polymer, and hence its effectiveness against etching by the fluorocarbon plasma, when the polymer overlies a non-oxide. However, this mechanism seems to be responsible for at least two problems if high selectivity is being sought. If excessive amounts of polymer are deposited on the oxide or nitride surfaces in the contact hole being etched, the hole can close up and the etching is stopped prior to complete etching of the hole. This deleterious condition is referred to as etch stop.

Further, the chemistry may be such that the polymer formation depends critically upon the processing conditions. It may be possible to achieve high selectivity with processing conditions produced by one set of processing parameters, but very small variations in those conditions may be enough to substantially reduce the selectivity on one hand or to produce etch stop on the other. Such variations can occur in at least two ways. The conditions at the middle of the wafer may vary from those at the center. Furthermore, the conditions may change over time on the order of minutes as the chamber warms up or on the order of days as the equipment ages or as chamber parts are replaced. It is felt that hardware can be controlled to no better than ±5 or 6%, and a safety margin or 3 to 6 is desired. Mass flow controllers 46 are difficult to control to less than ±1 sccm (standard cubic centimeter per minute) of gas flow so gas flows of any constituent gas of only a few sccm are prone to large percentage variations.

These factors indicate that a commercially viable etch process must have a wide process window. That is, moderate variations in such parameters as gas composition and chamber pressure should produce only minimal changes in the resultant etching.

Several oxide etch processes have been proposed which rely upon higher-order hydrogen-free fluorocarbons and hydrofluorocarbons, both generically referred to as fluorocarbons. Examples of higher-order fluorocarbons are fluoroethane, fluoropropane, and even fluorobutane, both in its linear and cyclic forms. In U.S. Pat. No. 5,423,945, Marks et al. disclose an oxide etch selective to nitride using $C_2F_6$ in an HDP etch reactor having a thermally controlled silicon surface. Later process work with the IPS chamber of FIG. 2 and other types of plasma reactors has emphasized $C_4F_8$ as the principal etchant species. As disclosed by Araki et al. in U.S. Pat. No. 5,770,098, argon (Ar) and carbon monoxide (CO) are often added to achieve the desired selectivity. Wang et al. have disclosed the use of fluoropropanes and fluoropropylenes, e.g., $C_3F_6$ and $C_3H_2F_6$, in U.S. patent application Ser. Nos. 08/964,504 and 09/049,862, filed Nov. 5, 1997 and Mar. 27, 1998 respectively. The two examples of fluorocarbons have F/C ratios of 2, as does $C_4F_8$, and some researchers, including Yanagida in U.S. Pat. No. 5,338,399, believe this value produces the best passivating polymer. We have observed, however, that the etching profile cannot be controlled with $C_3H_2F_6$.

If possible, it is desirable to use the already widely available fluoromethanes, which include carbon tetrafluoride ($CF_4$), trifluoromethane ($CHF_3$), difluoromethane ($CH_2F_2$), and monofluoromethane ($CH_3F$). Hung et al. in U.S. patent application Ser. No. 08/956,641, filed Oct. 23, 1997, suggest the use of $CHF_3$ and $CH_2F_2$. We have observed that this last combination is insufficiently selective, indicating poor polymer formation.

Although octafluorocyclobutane ($C_4F_8$) remains the most popular oxide etching gas, we observe that it suffers from too narrow a process window. Furthermore, although $C_4F_8$ is known to provide selectivity at the bottom of the etching hole, it provides little sidewall passivation, which is required for the desired vertical profiles. Also, $C_4F_8$ has a boiling point of 4 to 6° C., which is considered somewhat high for use as a gaseous etchant, especially in view of a trend to operate with very cold cathodes. Often carbon monoxide (CO) is added to $C_4F_8$ to increase the sidewall passivation as well as increase general nitride selectivity. However, CO is not only toxic, it also forms carbonyls with nickel and iron in gas cylinders and supply lines. The carbonyls are believed to contaminate wafers. For these reasons, the use of CO is preferably avoided.

The two approaches using alternatively the fluoromethanes and hexafluoropropane ($C_3H_2F_6$) both provide wider process windows with satisfactory etching characteristics, but we still believe that the process windows are too narrow and the etching characteristics can be further improved.

Hexafluoropropylene ($C_3F_6$) has also been investigated by Wang et al. in the previously cited patents. It has the F/C ratio desired by Yanagida in the previously cited patent. However, the results show insufficient selectivity. Yanagida also reports that the use of hexafluorocyclobutene (c-$C_4F_6$) produces good anisotropy and resist and silicon selectivities of 4 and 12 respectively. However, this isomer is highly toxic.

A theoretically promising etching gas is tetrafluoroethylene ($C_2F_4$). However, it is considered dangerously explosive.

Fukuta has disclosed an oxide etching process using hexafluoro-1,3-butadiene ($C_4F_6$) in Laid-Open Japanese Published Application (Kokai) 9-191002. However, he uses a magnetically enhanced capacitively coupled etch chamber. His structure requires selectivity only at the bottom of a contact hole, and he does not address the high selectivity required for contact holes in advanced processes like SAC. The capacitively coupled reactor does not allow the decoupling of the source and bias power. Kadomura in U.S. Pat. No. 5,366,590 discloses a SAC etching process using within a high-density plasma reactor hydrogen-free fluorocarbons with a C/F ratio approaching one. Among his preferred chemicals are hexafluorobutadiene, hexafluorocyclobutene, and hexafluorobenzene ($C_6F_6$). All his examples exclude the use of argon carrier gas, and the bias powers are relatively modest.

There are further considerations in selecting fluorocarbons for oxide etching. If a higher-order fluorocarbon is selected, a presently available commercial supply is greatly desired, even if a semiconductor grade needs to be developed. Furthermore, many of the higher-order fluorocarbons are liquids at near to room temperature. It is still possible to use liquid precursors by the use of bubblers to atomize the liquid in a carrier gas. However, bubblers present another expense, they need frequent maintenance, and the effective flow rate of the liquid precursor is difficult to tightly control. Gaseous precursors are much more preferred.

For these reasons, other fluorocarbon and hydrofluorocarbon etching gases are desired. Processing conditions need to be obtained for these other etching gases which produce high selectivity to nitride with a wide process window.

SUMMARY OF THE INVENTION

One aspect of the invention includes an oxide etching process using the unsaturated higher-order fluorocarbon such as hexafluorobutadiene ($C_4F_6$) and its isomers. A chemically inert diluent gas such as one of the noble gases, for example, argon (Ar). A wide process window is achieved when a large amount of the diluent gas is used, when the pressure is kept below about 20 milliTorr, and when the bias power nearly equals the source power.

The etch process can be performed in a plasma reactor utilizing a high-density plasma, such as an inductively coupled reactor, or in one using a lower-density plasma, such as a capacitively coupled reactor.

High selectivity to nitride, particularly nitride facets, may be achieved in a number of ways. A silicon-based solid material may be advantageously heated to about 225° C. to scavenge fluorine from the plasma to thereby improve the quality of the polymer. The power levels may be reduced as etch approaches the bottom of the hole being etched. A more heavily polymerizing gas may be added, such as a hydrofluoromethane, preferably difluoromethane ($CH_2F_2$). Preferably also the more heavily polymerizing gas is added only near the conclusion of the hole etch.

The invention may be extended to hexafluorocyclobutene (c-$C_4F_6$) and hexafluorobenzene ($C_6F_6$).

BRIEF DESCRIPTION OF THE DRAWINGS

FIG. 9 is a flow diagram of a two-step etch process in which power and pressure are varied.

FIG. 10 is a graph showing the nitride selectivity as a function of argon flow for hexafluorobutadiene as compared to octafluorocyclobutane.

FIG. 11 is a flow diagram of one embodiment of the integrated etching process of the invention.

DETAILED DESCRIPTION OF THE PREFERRED EMBODIMENTS

Figure 3:
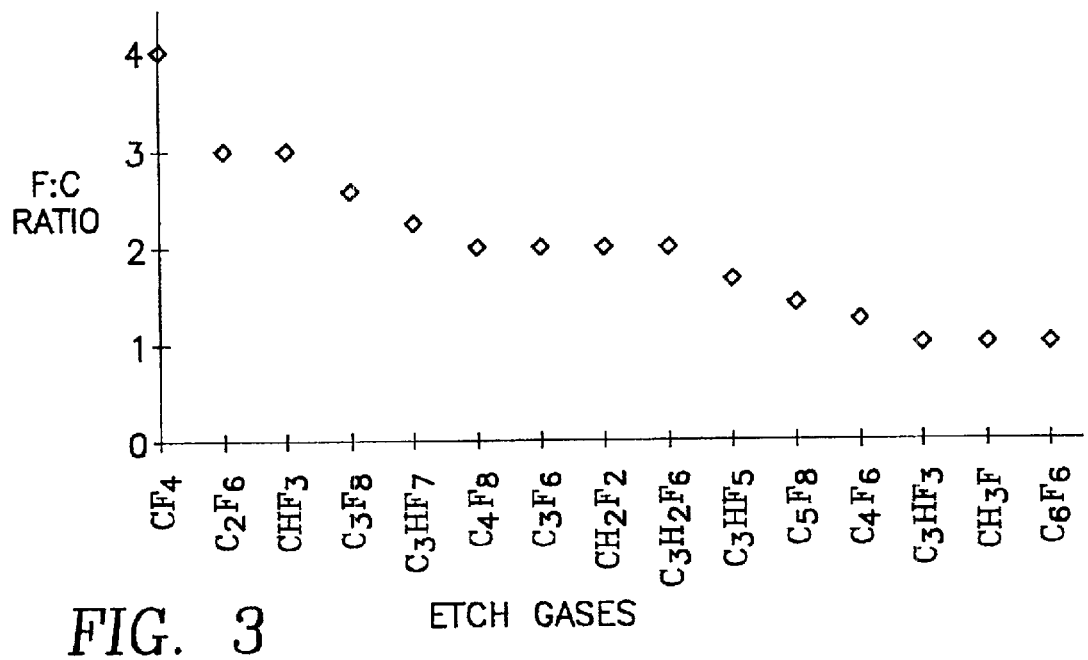
FIG. 3 is a graph comparing the fluorine-to-carbon ratios of a number of fluorocarbon and hydrofluorocarbon etching gases.

We believe that higher-order (heavy) fluorocarbons, specifically those having three carbons or more, and those having a F/C ratio of one or preferably greater but less than two will produce a polymer providing satisfactory etching characteristics with a wide process window. A chart of the F/C ratios for a number of fluorocarbons and hydrofluorocarbons is presented in FIG. 3. The fluorocarbons of more than four carbons are generally considered to be unnecessarily complex, especially since they tend to break up in a high-density plasma. However, hexafluorobenzene ($C_6F_6$) has promising physical characteristics which may overcome its size complexity. It is believed that those hydrofluorocarbons having a high hydrogen content, such as monofluoromethane ($CH_3F$) are too heavily polymerizing to serve as the primary etchant gas in deep oxide hole etching. Also, the high hydrogen content will reduce nitride selectivity and degrade the taper profile.

A high-density plasma tends to dissociate gas molecules into radicals. A longer carbon chain provides a larger variety of activated particles, including the $CF_2$* radical usually believed to be responsible for the formation of the fluorocarbon polymer chain. The longer carbon precursor atoms provide a larger variety of particles, which may be helpful in cross linking the polymer and the distribution of which may be controlled by different power levels in the HDP reactor. It is known that a low-fluorine polymer provides better selectivity probably because of increased cross linking resulting in a tougher, more protective polymer. Although an F/C ratio of two corresponds to a single segment of a fluorocarbon chain, it does not account for polymeric cross linking. Silicon-based fluorine scavenging is an attempt at reducing the fluorine content by scavenging any free radicals in the plasma. The longer carbon molecules with F/C ratios of less than two provide another mechanism for reducing the fluorine content of the polymer.

IPS Chemistry

Figure 4:
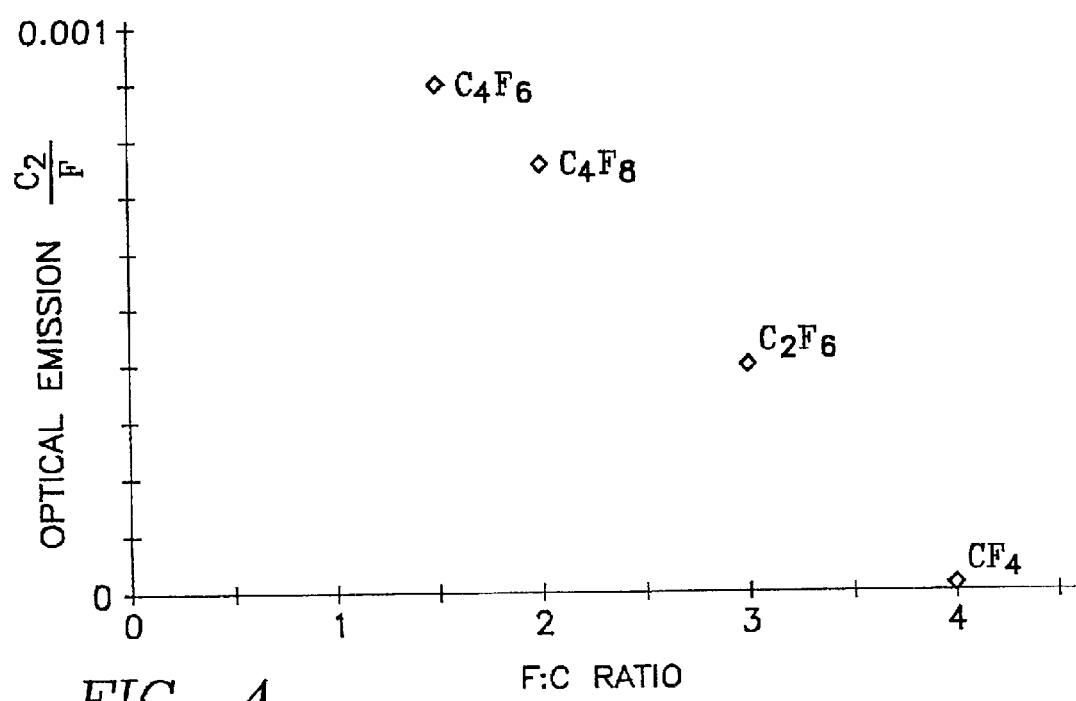
FIG. 4 is a graph illustrating the dependence of the ratio of carbon to fluorine radicals in a plasma as a function of the F:C ratio of the fluorocarbon.
Figure 5:
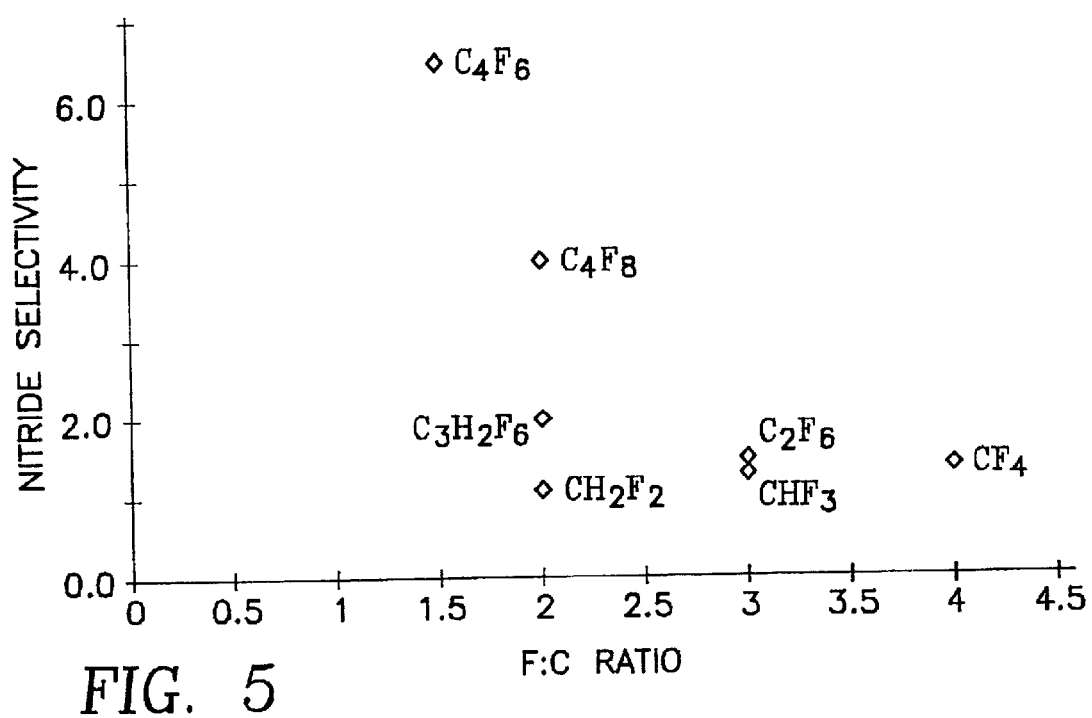
FIG. 5 is a graph illustrating the oxide-to-nitride selectivity for a number of the etching gases of FIG. 3 as a function of F/C ratio.

Optical emission spectroscopy was used in the IPS chamber to measure the ratio of the $C_2$ and F emissions for $CF_4$, $C_4F_6$, $C_4F_8$, and $C_2F_6$ used as the only fluorocarbon in a baseline recipe given in TABLE 1. The $C_2/F$ emission ratio is plotted in FIG. 4 in arbitrary units as a function of the F:C ratio of the gases. For at least these four gases, there is a negative linear relationship between the value of $C_2/F$ emission ratio and the F:C ratio, the lower the F:C value, the higher the $C_2/F$ value.

TABLE 1

| | |
|---|---|
| $C_xH_yF_z$ Flow (sccm) | 20 |
| Ar Flow (sccm) | 100 |
| Inner Source Power (W) | 0 |
| Outer Source Power (W) | 1400 |
| Bias Power (W) | 1400 |
| Pressure (mTorr) | 7 |
| Roof Temp. (° C.) | 200 |
| Ring Temp. (° C.) | 270 |
| Cathode Temp. (° C.) | +10 |
| Backside He Pressure (Torr) | 7 |

IPS Process

A number of the fluorocarbons and hydrofluorocarbons were preliminarily tested using the baseline recipe of TABLE 1 in the IPS reactor. The flows and power levels in the various recipes should be normalized to a 23 liter vacuum chamber and a 200 mm wafer having an area of 314 $cm^2$.

The fluorocarbon and hydrofluorocarbon etching gases combined with a sizable component of argon were applied to horizontally unpatterned wafers and the blanket oxide-to-nitride selectivities were measured. The selectivities as a function of F/C ratio are plotted in the graph of FIG. 4. These results clearly show an increased blanket selectivity to nitride for lower values of the F/C ratio.

The fluoropropane gas $C_3H_2F_6$ chosen by Wang et al. in the above cited patents is shown to have insufficient nitride selectivity despite its relatively low F/C ratio, but still higher than is now thought required. The currently dominant $C_4F_8$ has relatively good nitride selectivity, but even more is desired.

Figure 6:
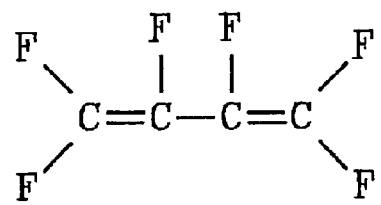
FIGS. 6 through 8 illustrate chemical structures of three etching gases of the invention.
Figure 7:
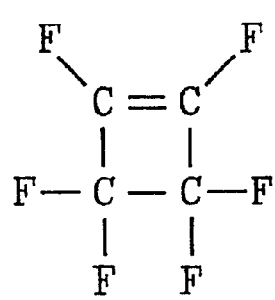
Figure 8:
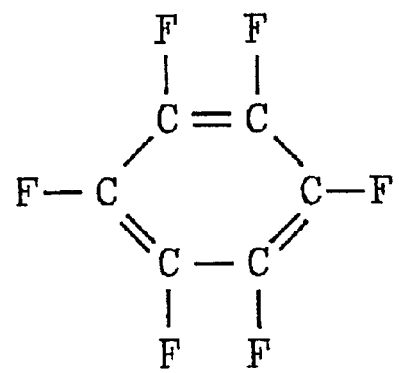

Of the gases tested, the one manifesting the best blanket nitride selectivity is hexafluorobutadiene ($C_4F_6$), alternatively called perfluorobutadiene. The isomer hexafluoro-1, 3-butadiene has a chemical structure illustrated in FIG. 6 with four carbon atoms, six fluorine atoms, and two double bonds. Its F/C ratio is 1.5. It has a molecular weight of 162 and a boiling point of 6–7° C. Its vapor pressure at 20° C. is 52 Torr. Although it is flammable, it is non-toxic. Another linear isomer is possible, but production methods are known for the illustrated one. A cyclic isomer is hexafluorocyclobutene (c-$C_4F_6$) having a chemical structure illustrated in FIG. 7. The plasma chemistry of c-$C_4F_6$ is expected to be much the same as the linear form of $C_4F_6$. However, c-$C_4F_6$ is considered to be toxic and explosive while the linear $C_4F_6$ is only flammable. Bargigia et al. have disclosed fabrication methods for hexafluorobutadiene in U.S. Pat. Nos. 4,654, 448 and 5,082,981, and it is commercially available.

One of the chemical advantages of $C_4F_6$ is that it is free of hydrogen. Similarly, hexafluorobenzene ($C_6F_6$) has a low F/C ratio and is hydrogen-free. It is a fully substituted cyclic or aromatic organic molecule having a chemical structure illustrated in FIG. 7 with six carbon atoms and six fluorine atoms. However, it disadvantageously is liquid and very viscous at room temperature, requiring the use of bubblers or other types of atomizers.

Extensive experimental data were obtained for the use of hexafluorobutadiene ($C_4F_6$) as the primary etching gas.

Further tests of the blanket etch nitride selectivity were performed using alternatively $C_4F_6$ and $C_4F_8$. The etch recipe generally followed that of TABLE 1, but the flow of the fluorocarbon was set to 14 sccm, and the argon flow was varied between the experiments. For $C_4F_6$ as the fluorocarbon, as the argon flow increases from 30 sccm to 500 sccm, the oxide etch rate decreases while the nitride etch rate is smallest at 30 sccm and 500 sccm. The nitride selectivity as a function of argon flow for the two gases is shown in the graph of FIG. 10. These results show that, for these processing parameters, $C_4F_6$ offers better blanket selectivity to nitride than $C_4F_8$, and that the best nitride selectivity is obtained for a $C_4F_6$ flow of 50 sccm and below. However, selectivity itself is insufficient since etch stop is likely to occur if the selectivity is achieved by excessive polymer deposition. As will be shown below, a minimum argon flow is dictated by the on set of etch stop. In contrast to the blanket selectivity for $C_4F_6$, the nitride selectivity for $C_4F_8$ trends in the opposite direction, indicating a different chemical regime.

A first etch recipe is listed in TABLE 2.

TABLE 2

|  | First Etch Recipe |
|---|---|
| $C_4F_6$ Flow (sccm) | 20 |
| $CH_2F_2$ Flow (sccm) | 0 |
| Ar Flow (sccm) | 100 |
| Inner Source Power (W) | 180 |
| Outer Source Power (W) | 1260 |
| Bias Power (W) | 1400 |
| Pressure (mTorr) | 4 |
| Roof Temp. (° C.) | 200 |
| Ring Temp. (° C.) | 270 |
| Cathode Temp. (° C.) | +10 |
| Backside He Pressure (Torr) | 7 |
| Time (s) | 120 |

Figure 2:
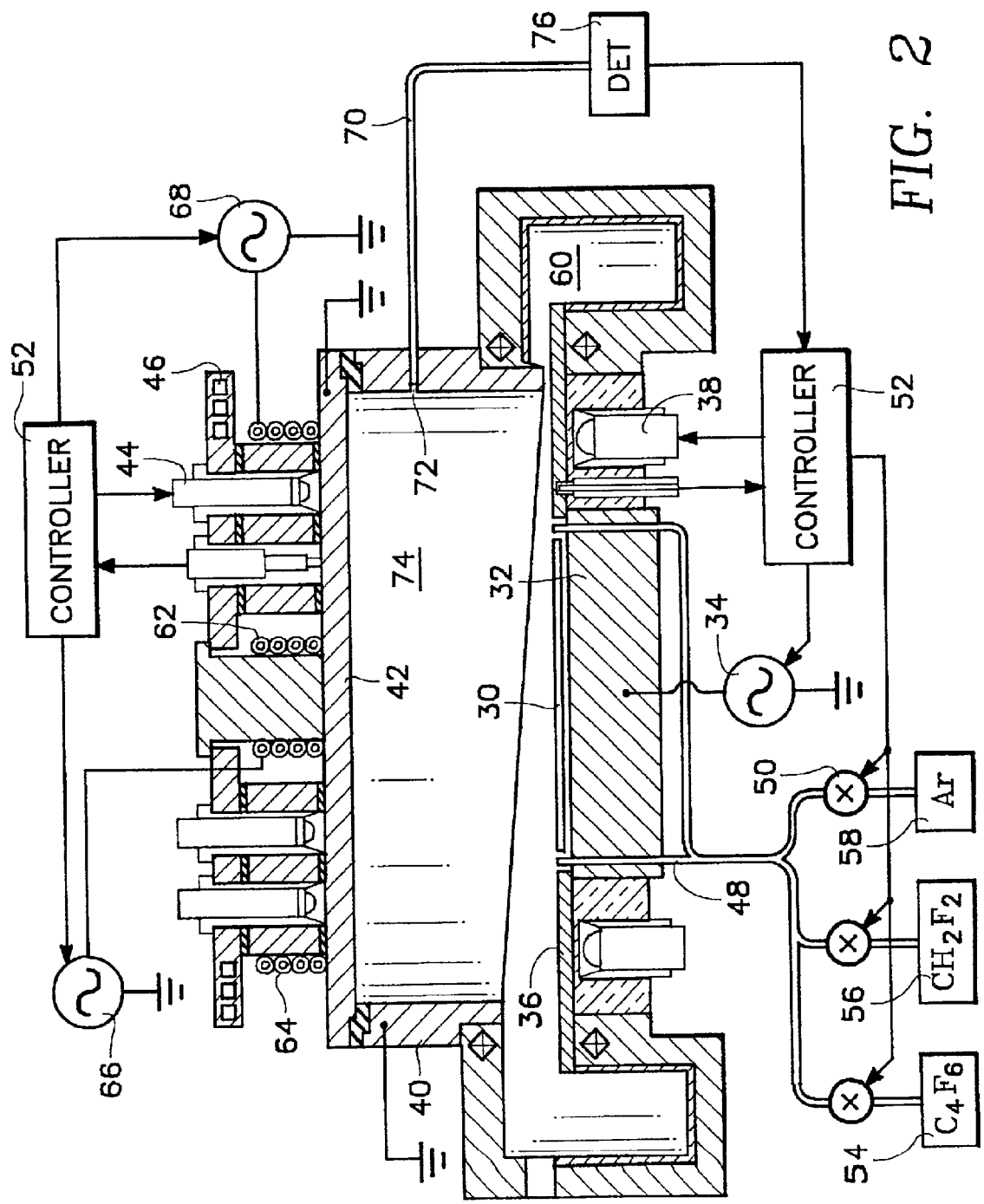
FIG. 2 is a schematic view, partly in cross section, of an inductively coupled high-plasma density etch reactor.

This recipe was tested in the IPS chamber illustrated in FIG. 2. The recipe is characterized as having a high argon content, a low pressure, and a relatively high silicon ring temperature. The bias power is relatively high compared to the source power of between 50% and 150%. However, the separate control of the bias power is considered important for obtaining high nitride selectivity with reasonable etching rates. The source power controls the ion and radical flux while the bias power controls the ion energy incident on the wafer. Too high an ion energy will result in a process resembling non-selective sputtering. The high-density plasma is further important because it produces a higher fraction of ionized etching particles, which can be directed by the DC self-bias of the pedestal to the bottom of holes with high aspect ratios.

Figure 1:
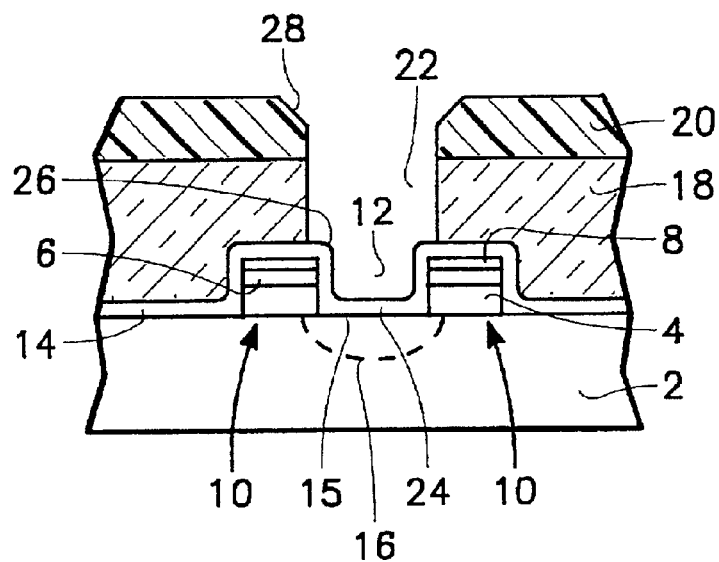
FIG. 1 is a cross-section view of a self-aligned contact (SAC) structure.

Two SAC structures, generally as illustrated in FIG. 1, were used in the experimental work. A first, short SAC structure has an oxide thickness of about 0.55 μm on top of a nitride-covered having a height of about 0.3 μm. That is, the total oxide etch depth is 0.85 μm.

The first recipe produces an oxide etch rate of about 600 nm/min. The profile varies over the wafer with angular values of about 87°. However, the selectivity is about 20:1 at the corner, and severe faceting is observed at the nitride corner.

No etch stop is observed with this recipe or with most of the other reported recipes. Unless etch stop is specifically reported hereafter for a particular recipe, it is not observed.

A series of experiments were performed to provide a matrix of results for variations in both the flow of $C_4F_6$ and the chamber pressure. The experiments were performed on a SAC structure having a via opening of 0.45 μm, a total oxide thickness of 0.92 μm, and a thickness for the nitride-covered gate structure of 0.38 μm. The etching was performed in an IPS reactor using the parameters in the recipe of TABLE 3 except that the $C_4F_6$ flow was tested at both 10 and 20 sccm and the chamber pressure at both 4 and 15 milliTorr.

TABLE 3

|  | Second Etch Recipe |
|---|---|
| $C_4F_6$ Flow (sccm) | 20 |
| Ar Flow (sccm) | 100 |
| Inner Source Power (W) | 340 |
| Outer Source Power (W) | 1020 |
| Bias Power (W) | 1400 |
| Pressure (mTorr) | 15 |
| Roof Temp. (° C.) | 200 |
| Ring Temp. (° C.) | 270 |
| Cathode Temp. (° C.) | +10 |
| Backside He Pressure (Torr) | 7 |
| Time (s) | 120 |

Samples were etched at the four set of parameters established by the ends of ranges for the fluorocarbon flow and the chamber pressure. Structures were etched and SEMs evaluated at different positions across the wafers. The general result is that an increase in $C_4F_6$ flow increases the nitride corner selectivity. A $C_4F_6$ flow of 10 sccm at either pressure severely and unacceptably degrades the nitride corner selectivity. Furthermore, an increase in chamber pressure at 20 sccm of $C_4F_6$ increases the etch verticality.

Under somewhat different conditions, the $C_4F_6$ flow was tested at 20, 25, and 30 sccm. An increased $C_4F_6$ flow improves the nitride corner selectivity. However, 25 sccm of $C_4F_6$ is the maximum flow without etch stop occurring somewhere on the wafer.

Based on these results, the first baseline recipe of TABLE 2 was established using a $C_4F_6$ flow of 20 sccm and a chamber pressure of 4 milliTorr.

The first baseline recipe was then varied to establish the effects of the argon flow. The most important etch stop results are summarized in TABLE 4. An argon flow of 50 sccm slightly improves the nitride corner selectivity over that at 100 sccm. A further decrease to 25 sccm of argon still does not produce etch stop. However, at 10 sccm of argon, etch stop is observed in a narrow hole one the side of one of the gate structures. Further decreasing the argon flow to zero produces severe etch stop at the level of the top of the gate structure for a lower width of 0.26 μm or at a level even higher than the top of the gate structure.

TABLE 4

| Ar Flow | $C_4F_6$ Flow (sccm) | | | |
|---|---|---|---|---|
| (sccm) | 15 | 20 | 25 | 30 |
| 0 |  | ES |  |  |
| 10 |  | ES |  |  |
| 25 | Nitride Loss | OK | ES | ES |
| 50 |  | OK |  |  |

A series of etch stop tests were performed with an argon flow of 25 sccm and varied values of the $C_4F_6$ flow. As mentioned before, at 20 sccm of $C_4F_6$ and 25 sccm of Ar, no etch stop is observed. At 25 sccm of $C_4F_6$, etch stop begins to appear with a thin polymer layer at the bottom of the hole. At 30 sccm of $C_4F_6$, etch stop is complete. On the other hand, when the $C_4F_6$ flow is reduced to 15 sccm, there is severe nitride loss.

Based on these results, we believe that the argon flow must be greater than that of the $C_4F_6$, more preferably twice as much, and most preferably four times as much to guarantee against etch stop in narrow, deep vias. However, the process window as measured by $C_4F_6$ flow is larger for larger Ar flow, at least larger than 15 sccm. The process window as determined by the Ar flow, a much wider window is obtained at 100 sccm of Ar than at 25 sccm. As previously described, the window at 100 sccm of Ar extends from at least from at least 16 sccm to 22 sccm of $C_4F_6$ flow and possibly even 25 sccm.

The effect of variations in the silicon ring temperature in the optimized recipe was then evaluated. Specifically, the ring temperature was alternatively set at 245, 270, and 350° C. The higher ring temperature slightly reduces the etch rate. The nitride corner selectivity increases with temperature.

A two-substep recipe was developed in which, as illustrated in the process flow diagram of FIG. 9, only $C_4F_6$ and Ar are used in both a main etch 78 and an over etch 79, but the power levels and chamber pressure are reduced in the over etch 79. This recipe is summarized in TABLE 5.

TABLE 5

|  | Main Etch | Over Etch |
| --- | --- | --- |
| $C_4F_6$ Flow (sccm) | 20 | 20 |
| Ar Flow (sccm) | 100 | 100 |
| Inner Source Power (W) | 0 | 0 |
| Outer Source Power (W) | 1600 | 1260 |
| Bias Power (W) | 1400 | 1080 |
| Pressure (mT) | 10 | 5.5 |
| Roof Temp. (° C.) | 200 | 200 |
| Ring Temp. (° C.) | 270 | 270 |
| Cathode Temp. (° C.) | +10 | +10 |
| Backside He Pressure (T) | 7 | 7 |
| Time (s) | 60 | 80 |

This recipe was proved on a SAC structure having 640 nm of oxide overlying gate structure having heights of 440 nm for a total oxide thickness of 1.1 $\mu$m. The via opening is 440 nm, but the gate structures are separated by a gap of only 85 nm.

Vertical profiles in the oxide are at least 88° over the entire wafer. Nitride corner faceting is observed but at an acceptable level. No etch stop is observed even in the narrow gate gap. The recipe shows adequate uniformity even with no inner source power.

A $C_4F_6$ process window was established for the recipe of TABLE 5 by varying the $C_4F_6$ flow to 16, 18, and 22 sccm. There is no significant change for faceting or vertical profile at any of these flows compared to the results at 20 sccm, and no etch stop is observed.

In order to increase the nitride selectivity for the $C_4F_6$ recipe and to decrease the nitride faceting, a more heavily polymerizing fluorocarbon gas may be included in the etching mixture as an additive to the $C_4F_6$. Generally, as explained with reference to FIG. 3, such an additive gas has a lower F:C ratio than $C_4F_6$ or is a hydrogen-containing fluorocarbon. Nonetheless, a fluoromethane is preferred. Difluoromethane ($CH_2F_2$) is less polymerizing than monofluoromethane ($CH_3F$) so that standard mass flow controllers can more easily meter its flow. A third etch recipe related to the non-additive recipe of TABLE 2 is summarized in TABLE 6. It has somewhat less $CH_2F_2$ than $C_4F_6$.

TABLE 7

|  | Main Etch | Over Etch |
| --- | --- | --- |
| $C_4F_6$ Flow (sccm) | 20 | 20 |
| $CH_2F_2$ Flow (sccm) | 0 | 10 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (mTorr) | 10 | 10 |
| Roof Temp. (° C.) | 230 | 230 |
| Ring Temp. (° C.) | 300 | 300 |
| Cathode Temp. (° C.) | +15 | +15 |
| Backside He Pressure (Torr) | 7 | 7 |
| Time (s) | 100 | 30 |

The third recipe was used with the first, shallow SAC structure described above. The observed oxide etch rate is about 620 nm/min, and the nitride selectivity is significantly improved to about 30:1. However, the profile angle when the entire etch uses the second recipe is substantially degraded to about 84°.

The addition of $CH_2F_2$ has two effects. It increases nitride selectivity but produces a more tapered profile, but its addition to $C_4F_6$ can be optimized to produce good selectivity and essentially vertical profiles. In contrast, a larger amount of $CH_2F_2$ needs to added to $C_4F_8$ to produce the same nitride selectivity, at which point the etching profile is substantially degraded.

Tests were performed to compare the addition of difluoromethane to that of tetrafluoroethane ($C_2H_2F_4$). The tests were performed with the first baseline recipe of TABLE 3 but with a chamber pressure of 4 milliTorr and with or without the addition of 15 sccm of either $CH_2F_2$ or $C_2H_2F_4$. The addition of $CH_2F_2$ improves the nitride corner selectivity and does not produce etch stop. The addition of $C_2H_2F_4$ causes some tapering as the profile angle decreases from 88° to 86° and produces etch stop at some locations on the wafer.

To combine the best features of both etch recipes, a two-step oxide etch recipe has been developed. As illustrated in the process flow diagram of FIG. 9, a main etch 80 is first performed using an etching gas mixture of $C_4F_6$ and argon. The main etch provides a fast etch rate and good vertical profiles. Then, an over etch 82 is performed in which the polymerizing $CH_2F_2$ is added in order to increase the nitride selectivity and to thus protect the nitride corners. Vertical profile is not so important in the over etch, especially when the main etch has already reached the nitride.

A first embodiment of the two-step etch recipe including an additive gas is summarized in TABLE 7.

TABLE 7

|  | Main Etch | Over Etch |
| --- | --- | --- |
| $C_4F_6$ Flow (sccm) | 20 | 20 |
| $CH_2F_2$ Flow (sccm) | 0 | 10 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (mTorr) | 10 | 10 |
| Roof Temp. (° C.) | 230 | 230 |

TABLE 7-continued

|  | Main Etch | Over Etch |
|---|---|---|
| Ring Temp. (° C.) | 300 | 300 |
| Cathode Temp. (° C.) | +15 | +15 |
| Backside He Pressure (Torr) | 7 | 7 |
| Time (s) | 100 | 30 |

This recipe was applied to the second, tall SAC structure. The profile angle in the oxide portion of the hole is observed to be at least 87°, and the nitride selectivity is acceptable.

The timing of the switch between the main etch and the over etch is chosen such that the main etch reaches the nitride bottom at most of the locations on the wafers and the over etch guarantees a complete etch without producing excessive nitride faceting. To provide further nitride protection, the changeover can be moved to a point where the main etch has passed the top of the nitride at most locations, that is, is somewhere in the gap between the gate structures. The changeover can be controlled dynamically by relying on optical emission spectroscopy or equivalent means tuned to an emission of a nitride byproduct. Thereby, the polymerizing gas is added as soon as the main etch has reached the top nitride at a significant number of locations.

A number of experiments were then performed to determine the process window and the fact that it is relatively wide. In a first pair of experiments, a one-step $C_4F_6/CH_2F_2$ etch was performed on the shallow SAC structure having a 0.35 μm trench aperture following alternatively the two variation recipes listed in TABLE 8.

TABLE 8

|  | First Var. | Second Var. |
|---|---|---|
| $C_4F_6$ Flow (sccm) | 17 | 25 |
| $CH_2F_2$ Flow (sccm) | 5 | 5 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (mTorr) | 4.5 | 4.5 |
| Roof Temp. (° C.) | 230 | 230 |
| Ring Temp. (° C.) | 300 | 300 |
| Cathode Temp. (° C.) | +10 | +10 |
| Backside He Pressure (Torr) | 7 | 7 |
| Time (s) | 150 | 150 |

These two recipes vary the flow of $C_4F_6$ by 15% about its baseline value of 20 sccm. The other parameters are somewhat different from the baseline values for the third recipe of TABLE 6, but are close enough to establish a window for the $C_4F_6$ in the critical over etch. Nitride corner etching is barely observable. The minimum profile angle varies between 3° and 4° between the two recipes, which is better than the 84° of the second etch recipe of TABLE 1. Inward tapering occurs at the bottom of the etch. Similar results are observed with 0.4 μm trenches.

This ±15% window for $C_4F_6$ flow is to be compared with the window for an optimized $C_4F_8$ recipe of 15 sccm of $C_4F_6$ and 28 sccm of $CH_2F_2$ with other parameters similar to those for a $C_4F_6$ etch. A 20% reduction of the $C_4F_8$ flow to 12 sccm produces severe nitride faceting to the extent of punch through at some locations. A 20% increase to 18 sccm produces very good nitride corner selectivity but increases tapering to the extent that some oxide is not etched at the side of the gate structure.

Although only the flow of the main fluorocarbon gas was varied in these window tests, the various components of a recipe are interrelated so that significant windows should exist for variations of the other recipe components.

The baseline two-step recipe of TABLE 7 was varied to decrease the silicon ring temperature to 255° C. in both the main etch and the over etch. For both the shallow and tall SAC structures, the lower ring temperature increases the profile angle to at least 88° and eliminates sidewall oxide that tends to form on the walls of the nitride at the bottom of the trench. Nitride corner selectivity decreases somewhat, but it is still acceptable.

In two further experiments, the over etch recipe was modified to include 20 sccm of $C_4F_6$ and 5 sccm of $CH_2F_2$. A satisfactory etch is obtained at silicon temperatures of 300° C. for the ring and 230° C. for the roof. However, if the ring temperature is reduced to 245° C. and the roof temperature to 220° C. with the same flow of $CH_2F_2$, the nitride corner is severely faceted. If the $CH_2F_2$ flow is then increased to 20 sccm at the lower silicon temperatures, corner selectivity is returned. Thus, silicon scavenging by the hot silicon parts can be traded off against the polymerization produced by the $CH_2F_2$. Third and fourth variant recipes for the over etch are listed in TABLE 9.

TABLE 9

|  | Third Var. | Fourth Var. |
|---|---|---|
| $C_4F_6$ Flow (sccm) | 20 | 20 |
| $CH_2F_2$ Flow (sccm) | 15 | 5 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (mTorr) | 4.5 | 4.5 |
| Roof Temp. (° C.) | 200 | 230 |
| Ring Temp. (° C.) | 245 | 300 |
| Cathode Temp. (° C.) | +10 | +10 |
| Backside He Pressure (Torr) | 7 | 7 |
| Time (s) | 150 | 150 |

Both variant recipes applied to a one-step etch of the shallow SAC structure show a satisfactory etch. Nitride corner etching is not readily observable, and the profile angle is at least 86°, which is acceptable for the over etch.

Two sets of experiments were performed to determine the sensitivity to pressure variations. In the first set, a main etch recipe with no $CH_2F_2$ was used to etch the entire oxide layer, both in a shallow and in a tall SAC structure. The pressure was alternatively set at 10, 15, and 20 milliTorr. The minimum profile angles decreases from 88° at 10 milliTorr, to 87° at 15 milliTorr, and to 86° at 20 milliTorr, all considered to be acceptable values. The previously described lower sidewall tapering is observed at all pressures. Without the polymerizing $CH_2F_2$, significant but not severe nitride corner faceting is observed, particularly at the lower pressure, and a 100 s etch tends to punch through the bottom nitride layer. However, the over etch recipe is intended to circumvent the poor nitride selectivity of the main etch recipe. Thus, over the pressure range of 10 to 20 milliTorr, the main etch performs satisfactorily.

In a second set of experiments, an over etch recipe was used to etch a short SAC structure and the pressure was alternately set to 4.5 and 7 milliTorr. No nitride corner etching is readily observable at either pressure.

In the integrated etching process of FIG. 9, after the completion of the main etch 80 and the over etch 82, an ashing step 84 removes the remaining photoresist and deposited polymer, usually with an unbiased oxygen plasma. Then, a nitride etch step 86 removes the nitride portion 26 remaining at the bottom of the hole 22, as illustrated in FIG. 1. This step typically uses a fluorocarbon, such as $CH_2F_2$, in combination with argon and oxygen in a soft plasma etch. The oxygen destroys any nitride selectivity. Hung et al. describe these final steps in U.S. patent application Ser. No. 09/149,810, filed Sep. 8, 1998. If the structure contains on its top an anti-reflective coating (ARC) or a hard mask, both typically formed of silicon nitride although other materials may be used, the integrated etching process begins with an ARC or mask opening step.

Although the main etching steps described above do not use any polymerizing fluoromethane, it is understood that nearly the same effect can be achieved by flowing in the main etch no more than 20% of the fluoromethane used in the over etch.

The examples reported above were obtained on the inductively coupled IPS reactor capable of producing a high-density plasma. Other inductively coupled plasma etch reactors are available with a variety of coil configurations. The current inductively coupled HDP reactors have the advantage of decoupling the source power from the bias power, thus allowing a reasonable etching rate with low ion energies. There are other ways of decoupling the source and bias power, for example, with a remote plasma source (RPS) or with an electron-cyclotron resonance (ECR) reactor. Many of the features of the invention find applicability with capacitively coupled plasma reactors, especially those that are magnetically enhanced to increase plasma densities.

MxP Reactor

Figure 12:
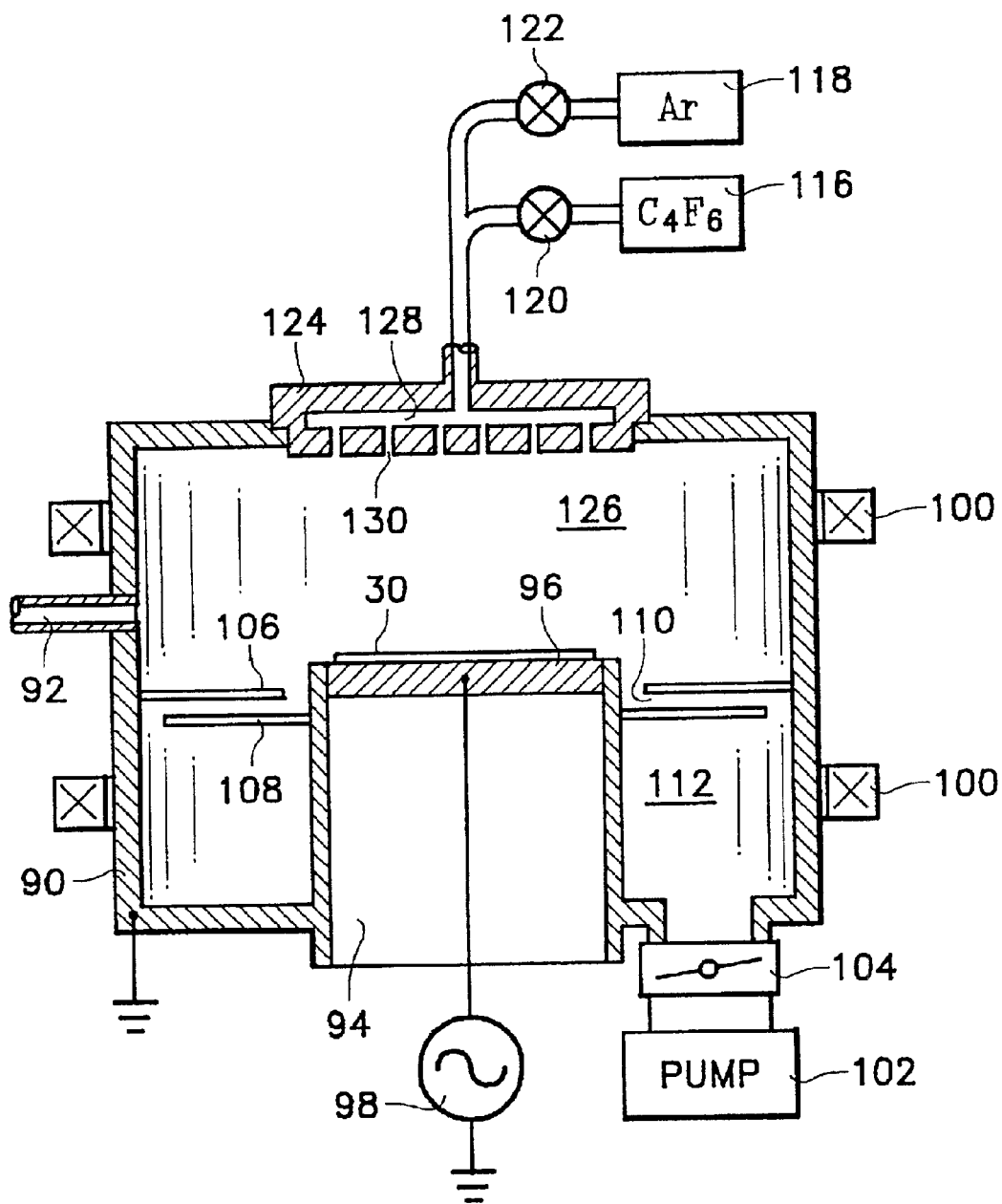
FIG. 12 is a schematic view, partly in cross section of a capacitively coupled etch reactor.

The results above have been obtained on an HDP reactor having separately controlled source and bias powers. At least some aspects of the invention are also applicable to more conventional capacitively coupled plasma reactors usually operating with a plasma not qualifying as high-density. An example of such a reactor is a magnetically enhanced reactive ion etcher (MERIE), such as the $MxP^+$, available from Applied Materials and illustrated schematically in the cross-sectional view of FIG. 12. It includes a grounded vacuum chamber 90, perhaps including liners to protect the walls. The wafer 30 is inserted into the chamber 90 through a slit valve opening 92 and placed on a cathode pedestal 94 with an electrostatic chuck 96 selectively clamping the wafer. The chuck powering is not illustrated. An RF power supply 98, preferably operating at 13.56 MHz, is connected to the cathode pedestal 94 and provides the only significant generation of the plasma. Magnetic coils 100 powered by unillustrated current supplies surround the chamber 90 and generate a rotating, horizontal magnetic field in order to increase the density of the plasma. A vacuum pump system 102 pumps the chamber 90 through an adjustable throttle valve 104. Shields 106, 108 not only protect the chamber 90 and pedestal 94 but also define a baffle 110 and a pumping channel 112 connected to the throttle valve 104.

Processing gases are supplied from gas sources 116, 118 through respective mass flow controllers 120, 122 to a quartz gas distribution plate 124 positioned in the roof of the chamber 90 overlying the wafer 30 across a processing region 126. The distribution plate 124 includes a manifold 128 receiving the processing gas and communicating with the processing region 126 through a showerhead having a large number of distributed apertures 130 so as to inject a more uniform flow of processing gas into the processing region 126.

MxP Process

Initial process experiments were performed using hexafluorobutadiene in the capacitively coupled MxP reactor. It is believed that even with the magnetic enhancement the MxP reactor is not capable of producing a high density plasma. That is, the results presented here utilize a low-density plasma having ionization densities lower than $10^{11}$ $cm^{-3}$.

Because $C_4F_8$ processes when applied to advanced applications like SAC have generally needed substantial CO to achieve the required nitride recipe, such a CO-rich recipe, as summarized in TABLE 10 was tested on a SAC structure having 100 nm of TEOS oxide, acting as an anti-reflection coating (ARC), overlying 800 nm of borophosphosilicate glass (BPSG), which is a form of silica. A 100 nm silicon nitride coating conformally coated the gate structure and the bottom of the via to be etched. Via holes were masked to a diameter of 0.4 μm.

TABLE 11

|  | 1 | 2 | 3 | 4 |
|---|---|---|---|---|
| $C_4F_6$ Flow (sccm) | 4 | 4 | 7 | 7 |
| Ar Flow (sccm) | 295 | 150 | 80 | 150 |
| Pressure (mTorr) | 85 | 85 | 50 | 50 |

The first step is used to open the TEOS ARC layer. The second step is the final etch and must provide adequate selectivity to nitride without etch stop. The results show a fairly low etch rate of 360 nm/min, but the nitride corner loss is only 10 to 20 nm with about a 50% overetch. The profile angle is 87° or better. No etch stop is observed even in a 9 nm wide gap between the two nitride-covered gate structures. These superior results are obtained without attempting to optimize the process. Even though the recipe is rich in carbon monoxide, the CO flow is less than 50% of the total gas flow and is no more than the Ar flow.

In view of the problems associated with CO, a series of experiments were performed using only $C_4F_6$ and Ar on test wafers covered with a uniform layer of BPSG, over covered with the TEOS ARC layer and masked for 0.4 μm via holes. The tests were performed to study the dependence of etch rate, profile angle, and etch stop on the gas flows and pressure. The other process conditions for the main etch were those of TABLE 10. The other conditions are listed for four experiments in TABLE 11.

TABLE 11

|  | 1 | 2 | 3 | 4 |
|---|---|---|---|---|
| $C_4F_6$ Flow (sccm) | 4 | 4 | 7 | 7 |
| Ar Flow (sccm) | 295 | 150 | 80 | 150 |
| Pressure (mT) | 85 | 85 | 50 | — |

The first two experiments were performed at a relatively high pressure of 85 milliTorr and with 4 sccm of $C_4F_6$. At the higher argon flow of 295 sccm, the profile angle is 87°, while at 150 sccm of Ar, it is about 85°. The second two experiments were performed at a somewhat lower pressure of 50 milliTorr and with 7 sccm of $C_4F_6$. At the higher argon flow of 150 sccm, the profile angle is 85°, while at 80 sccm of argon, it is about 83°. In no case is etch stop observed after etching through about 1.1 μm of BPSG. The conclusion is that a relatively high flow of argon, especially relative to the flow of $C_4F_6$, produces a more vertical profile. The results also show a better profile at higher pressure.

Some further tests show that a high flow of $C_4F_6$ and no argon produces etch stop. Even 10 sccm of $C_4F_6$ and 150 sccm of Ar at 50 milliTorr produces etch stop. Carbon monoxide seems incapable of preventing etch stop in the absence of argon, as shown by the following tests. A main etch step was performed with 4 sccm of $C_4F_6$, 295 sccm of CO and either 295 sccm of Ar or no Ar. Without argon, etch stop is observed about half-way down a 0.4 µm via hole. With argon, etching continues with profile angles of about 85°. Hence, it appears that the Ar flow should be at least 20 times that of $C_4F_6$ to prevent etch stop. The higher argon flow also improves uniformity.

A CO-free recipe was then tested on a SAC structure generally using the two-step recipe of TABLE 10 but using for the main etch 7 sccm of $C_4F_6$ and 150 sccm of Ar at 50 milliTorr but neither CO nor $O_2$. The etch rate is 320 nm/min and the taper profile is less than 85°. The corner nitride selectivity is unsatisfactory exposing the gate metal, but the bottom nitride selectivity is good. No etch stop is observed even when the gap between the nitride-covered gate structures is 4 nm. With further optimization, we believe that a satisfactory CO-free process can be developed for the MxP. The nitride corner selectivity can be improved by including a more polymerizing gas, for example a hydrofluorocarbon such as $CH_2F_2$. Problems with etch stop that the additional polymerization may introduce can be counteracted by the use of $N_2$ or $O_2$. If CO is used to enhance selectivity with $C_4F_6$ and Ar, the CO flow fraction may be less with $C_4F_6$, even substantially less than 50%.

Although effective pressure ranges have not been investigated, it is believed that effective processes in a low-density plasma can be established in the range of 20 to 150 milliTorr. Bias power, which should be normalized to a 200 mm wafer, primarily affects the oxide etch rate in the preferred high power range. Between 1000 W and 1500 W, increased power does not increase the oxide etch rate and decreases nitride selectivity. Between 1500 W and 1800 W, the oxide etch rate increases with little change in nitride selectivity.

In one aspect of the invention, the etching gas of the invention can be characterized as consisting essentially of a fluorocarbon gas and a chemically inactive gas. The fluorocarbon gas consists of a principal fraction of hexafluorobutadiene or related gases and may additionally include other hydrogen-free fluorocarbon or hydrofluorocarbon gases. To achieve selectivity without etch stop in narrow holes, the amount of the chemically inactive gas should be greater than that of the fluorocarbon gas in a high-density plasma and should be greater than 20 times that of the fluorocarbon gas in a low-density plasma. Little or no CO or nitrogen is required. It is of course appreciated if an amount of CO is added that is less than half that of $C_4F_6$, especially in an HDP process, and less than half the total flow in a capacitively coupled process. The chemistry differs from that disclosed by Araki et al., which relies upon a substantial fraction of CO and a lesser amount of Ar for selectivity.

Although argon is the usual chemically inactive carrier gas, other gases can be substituted, such as the other rare gases, such as neon, krypton, and xenon. Hung et al. in the patent application Ser. No. 09/276,36, filed Mar. 25, 1999, incorporated herein by reference in its entirety, disclose unexpectedly good oxide etching results using xenon as the inactive diluent gas, particularly in combination with $C_4F_6$.

Although the description above concentrated on selectivity to nitride, the mechanisms involved in selective oxide etching depend principally as far as materials are concerned upon whether the layer contains a significant amount of oxygen or not. Therefore, the same chemistry is applicable to etching oxide over a non-oxide layer or feature. Silicon is one such material, as is found for contact etches.

Although the above results were derived from experiments performed on SAC structures, there are other structures in which high nitride corner selectivity is required. A pair of examples include structures in which a nitride layer is used as a mask. A first example is a silicon nitride hard mask placed between the photoresist and the oxide layer. A first etching step etches the photoresist pattern into the hard mask. Thereafter, a second etching step etches the oxide layer according to the pattern of the hard mask. In the second step, photoresist selectivity is not required, but the nitride corner of the hard mask is exposed throughout most of the second step so that high nitride corner selectivity is required. A second example is a self-aligned local interconnect (SALI), as Wang et al. describe in U.S. patent application Ser. No. 08/964,504, filed Nov. 5, 1998. In the SALI structure the nitride covered gate structure may be completely exposed, and further a planar bottom nitride is exposed for a long period. A third example is a dual-damascene structure, as Tang et al. describe in U.S. patent application Ser. No. 09/112,864, filed Jul. 9, 1998. In this structure, a nitride layer separates two levels of oxide. Because nitride acts as a stop layer, one etching step, sometimes in combination by an initial etch, can etch the lower oxide layer into one feature and concurrently etch the upper oxide layer into a connected, larger feature. The patterned nitride layer operates either as a stop layer or as an intermediate mask. The intermediate nitride layer is substantially planar but has a corner surrounding an aperture opening into the lower dielectric layer so that high nitride selectivity is required.

The oxide etching process of the invention thus provides superior etching characteristics with the use of gases which are relatively novel to semiconductor processing but which are commercially available. The other process parameters are achievable in commercially available plasma reactors.

What is claimed is:

1. An oxide etch process for etching an oxide layer over a non-oxide layer, comprising the steps of:

flowing into a plasma reaction chamber an etching gas mixture comprising (a) a heavy fluorocarbon selected from the group consisting of hexafluorobutadiene, (b) a hydrofluoromethane, (c) a polymerization counteracting gas selected from the group of oxygen gas and nitrogen gas; and (d) a chemically inactive gas selected from the group of argon and xenon, a diluent flow of said chemically inactive gas being at least equal to an active flow of said heavy fluorocarbon; and RF biasing a pedestal electrode supporting a substrate having an oxide layer overlying a nitride layer and exciting said etching gas mixture into a plasma to thereby etch said oxide layer selectively to said non-oxide layer.

2. The process of claim 1, wherein said non-oxide layer is a nitride layer.

3. The process of claim 2, wherein said nitride layer has a nitride corner.

4. The oxide etch process of claim 1, further comprising maintain a pressure within said chamber of no more than 30 milliTorr.

5. The process of claim 1, wherein said polymerization counteracting gas comprises nitrogen gas.

6. The process of claim 1, wherein said polymerization counteracting gas comprises oxygen gas.

7. The process of claim 1, wherein said hydrofluoromethane is difluoromethane.

8. The process of claim 7, wherein said polymerization counteracting gas comprises nitrogen gas.

9. The process of claim 7, wherein said polymerization counteracting gas comprises oxygen gas.

10. The process of claim 1, further comprising maintaining a silicon-containing surface in said chamber at a temperature of at least 225° C. to thereby scavenge fluorine from said plasma.

11. The process of claim 1, wherein said exciting step includes applying oscillatory power to said etching gas mixture from a power supply separate from that RF biasing said pedestal.

12. The oxide etch process of claim 11, wherein said step of applying oscillatory power comprises applying RF power to an inductive coil adjacent to said chamber.

13. The process of claim 1, wherein said etching gas mixture includes substantially no carbon monoxide.

14. The oxide etch process of claim 1, wherein said step of biasing said pedestal electrode excites said etching gas mixture into said plasma, no other substantial source of electrical power being applied to said gas mixture.

15. The process of claim 1, wherein said etching gas mixture additionally comprises carbon monoxide.

16. The oxide etch process of claim 1, wherein said hydrofluoromethane has no more than two hydrogen atoms.

17. The oxide etch process of claim 16, wherein said hydrofluoromethane comprises difluoromethane.

18. A method of etching an oxide layer over a silicon-containing non-oxide layer, comprising the steps of
flowing into a plasma reactor a gas mixture comprising a
(a) a fluorocarbon gas including hexafluorobutadiene, (c) a hydrofluoromethane, (c) a polymerization counteracting gas selected from the group consisting of nitrogen gas and oxygen gas, (d) and a chemically inactive gas but not comprising carbon monoxide;
supporting a substrate containing said oxide layer over said non-oxide layer on a pedestal electrode; and
exciting said gas mixture into a plasma including applying RF power to said pedestal electrode to thereby etch said oxide layer scievtively to said non-oxide layer.

19. The method of claim 18, wherein said exciting step includes remotely exciting said gas mixture into a plasma.

20. The method of claim 19, wherein said step of remotely exciting includes inductively coupling RF power into said reactor.

21. The method of claim 19, wherein said hydrofluoromethane comprises difluoromethane.

22. The method of claim 19, wherein said RF power applied to said pedestal electrode excites said etching gas mixture into said plasma, no other effective source of oscillatory power being applied to said chamber.

23. The method of claim 19, wherein said polymerization counteracting gas comprises oxygen gas.

24. The method of claim 23, wherein said hydrofluoromethane comprises difluoromethane.

25. The method of claim 18, wherein said polymerization counteracting gas comprises oxygen gas.

26. The method of claim 18, wherein said non-oxide layer is a nitride layer.

27. A method of etching an oxide layer over a silicon-containing non-oxide layer in a capacitively coupled reactor, comprising the steps of:
flowing into a plasma reactor a gas mixture comprising hexafluorobutadiene, oxygen gas, hydrofluoromethane, and argon;
supporting a substrate containing said oxide layer over said non-oxide layer on a pedestal electrode; and
applying RF power to said pedestal electrode to thereby excite said gas mixture into a plasma to thereby etch said oxide layer selectively to said non-oxide layer.

28. The method of claim 27, wherein said non-oxide layer is a nitride layer.

29. The method of claim 27, further comprising applying a magnetic field into a region of said reactor containing said plasma.

30. The method of claim 29, wherein said magnetic field extends in parallel to a surface of said substrate.

31. The method of claim 27, wherein said gas mixture is excited into said plasma without the use of inductively coupled RF power.

32. The method of claim 27, wherein said gas mixture includes effectively no CO.

33. The method of claim 27, wherein said gas mixture additionally comprises CO.

34. A dual damascene etch process for etching an oxide layer overlying a stop layer, comprising the steps of:
providing a substrate having a dielectric level including a lower oxide layer, an upper oxide layer, and a silicon nitride layer intermediate said upper and lower oxide layers;
flowing into a plasma reaction chamber an etching gas mixture comprising hexafluorobutadiene and a chemically inactive gas but including essentially no oxygen-containing gas; and
exciting said etching gas mixture into a plasma to etch said upper oxide layer with selectivity to said silicon nitride layer, whereby said silicon nitride layer operates as said stop layer.

35. The process of claim 34, wherein said etching process etches said upper oxide layer with a selectivity of at least 20:1.

36. The process of claim 34, wherein said plasma is not a high-density plasma.

37. The process of claim 34, wherein said plasma reaction chamber is a magnetically enhanced capacitively coupled plasma reactor.

38. A dual damasceue etch process for etching an oxide layer underlying a masking layer, comprising the steps of
providing a substrate having a dielectric level including a lower oxide layer, an upper oxide layer, and a silicon nitride layer intermediate said upper and lower oxide layers and having during a portion of said etch process formed therein an aperture surrounded by a exposed upper surface of said silicon nitride layer;
flowing into a plasma reaction chamber an etching gas mixture comprising hexafluorobutadiene and a chemically intactive gas but including essentially no oxygen-containing gas; and
exciting said etching gas mixture into a plasma to etch said lower oxide layer with selectivity to said silicon nitride layer, whereby said silicon nitride layer operates as said masking layer.

39. The process of claim 38, wherein said etching process etches said lower oxide layer with a selectivity of at least 20:1 to a corner of said silicon nitride layer adjacent said aperture.

40. The process of claim 38, wherein said plasma is not a high-density plasma.

41. The process of claim 38, wherein said plasma reaction chamber is a magnetically enhanced capacitively coupled plasma reactor.

* * * * *